United States Patent [19]

Corney

[11] Patent Number: 4,532,630
[45] Date of Patent: Jul. 30, 1985

[54] SIMILAR-REDUNDANT SIGNAL SYSTEMS

[75] Inventor: John M. Corney, Kent, England

[73] Assignee: Marconi Avionics Limited, England

[21] Appl. No.: 378,726

[22] Filed: May 17, 1982

[30] Foreign Application Priority Data

May 28, 1981 [GB] United Kingdom ............. 8116384

[51] Int. Cl.³ .................................. G06F 11/16
[52] U.S. Cl. .................................. 371/68; 371/36
[58] Field of Search ............... 371/36, 67, 68; 340/146.2; 318/564; 250/209; 328/148; 307/441

[56] References Cited

U.S. PATENT DOCUMENTS

| | | | |
|---|---|---|---|
| 3,334,282 | 10/1967 | Wolfe | 318/564 |
| 3,444,516 | 5/1969 | Lechleider | 371/68 |
| 3,501,743 | 3/1970 | Dryden | 371/36 |
| 3,665,173 | 5/1972 | Bouricius et al. | 371/36 |
| 3,805,235 | 4/1974 | Foster et al. | 371/68 |
| 3,812,476 | 5/1974 | Cragon | 371/36 |
| 3,833,798 | 9/1974 | Huber et al. | 371/68 |
| 3,848,116 | 11/1974 | Möder et al. | 371/68 |
| 4,327,437 | 4/1982 | Gelderloos | 371/68 |

Primary Examiner—Jerry Smith
Assistant Examiner—Mark Ungerman
Attorney, Agent, or Firm—Kirschstein, Kirschstein, Ottinger & Israel

[57] ABSTRACT

In a similar-redundant signal system employing two or more channels, the signals in the different channels below a predetermined frequency are equalized, the equalization preferably being performed digitally. The equalization reduces the slight differences between signals in the different channels in the absence of channel failure, and thus enables the thresholds for channel failure detection by comparison of the signals in different channels to be reduced.

5 Claims, 3 Drawing Figures

SIMILAR-REDUNDANT SIGNAL SYSTEMS

This invention relates to a similar-redundant signal systems.

BACKGROUND OF THE INVENTION

1. Field of the Invention

A similar-redundant signal system employs a plurality of identical signal paths, commonly called channels, each of which includes elements such as sensors, amplifiers, computers and servo actuators serially connected to form the signal path. The several channels operate in parallel so that so long as at least one channel is operating correctly, the system will continue to operate adequately, thus providing a high degree of security against failure.

In such a system it is possible to detect failures by comparing nominally equivalent signals in the different channels of the system.

2. Description of the Prior Art

FIG. 1 of the accompanying drawings illustrates in simplified diagrammatic form part of a prior art similar-redundant signal system employing such a failure detection arrangement.

Referring to FIG. 1, the system includes three identical channels A, B and C each of which includes a sensor 1A, 1B or 1C whose output is fed to a computing element 3A, 3B or 3C whose output is in turn fed to the next element (not shown) in the channel, and so on to each element of the channel in turn.

The outputs of the three sensors 1A, 1B and 1C are fed to a first comparator 5 and the outputs of the three computing elements 3A, 3B and 3C are applied to a second comparator 7, the outputs of the further unillustrated elements being similarly fed to further respective comparators (not shown).

Each comparator such as 5 or 7 compares its input signals and if one of these signals becomes significantly different from the others, appropriate remedial action is taken. It will be appreciated that the appropriate remedial action will depend on the system configuration and design philosophy. Thus, whereas in some cases detection of a failure will require isolation of the failed channel leaving the remaining channels in operation, in other cases a failure might temporarily be tolerated unless and until a further failure occurs elsewhere in the system. In a system having only two channels, the only possible action may be merely to give warning of the fault.

It will be appreciated that the sensors 1A, 1B and 1C will ideally be identical to each other, as will computing elements 3A, 3B and 3C and other corresponding elements in the system, in order that the signal comparison process can operate most effectively. The reason for this is that, in normal operation (i.e. without any failure), the similar-redundant signals which are being compared will then be identical to each other, and therefore a failure in any of the channels can be detected by a very small difference only between signals. In other words the failure detection theshold of the comparison process can be very small if the similar-redundant signals are closely matched to each other in normal operation.

However, in practice, the sensors, computing elements etc. are merely nominally identical and exhibit differences with respect to each other, without any failures having occurred, as a result of manufacturing tolerances or differing environmental effects on the channel elements.

Because of such variations the failure detection thresholds in the comparison processes need to be increased in order to eliminate the possibility of false failure indications in normal operation. Clearly an increase in these failure detection thresholds is detrimental to the ability of the comparison process to detect failures quickly and without undue disturbance to the system as a whole.

SUMMARY OF THE INVENTION

1. Features of the Invention

It is an object of the present invention to provide a similar-redundant signal system wherein this problem is alleviated.

According to the present invention, a similar-redundant signal system comprises: a plurality of nominally identical signal paths each comprising a number of elements serially connected; a failure detection arrangement comprising comparator means wherein nominally equivalent signals in the paths are compared; and means for equalizing the components below a predetermined frequency in the signals in the different paths at corresponding locations upstream of the failure detection arrangement by at least one element. 2. Brief Description of the Invention Preferably the equalizing means utilises digital processing for equalization.

The invention resides partly in the realisation by the inventor that the above-mentioned problem of fault detection thresholds can be overcome by signal equalization at appropriate locations in the system. However, at least as important is the inventor's discovery that in many systems equalization of only lower frequency components of the signals is necessary, and that it is not necessary to attempt to equalize the signals over their full frequency spectrum. As a consequence of this discovery the possibility of overcoming the problem of fault detection thresholds by signal equlization becomes practical which it would otherwise not be, especially if equalization is effected using digital processing, when the computing power needed i.e. the speed at which arithmetic and logic functions need to be performed, becomes prohibitive if the signals are required to be equalized over their full frequency spectrum.

In this connection it will be understood that in a system according to the present invention the selection of a suitable value for the predetermined frequency is governed by the conflicting requirements that the predetermined frequency shall be as high as possible in order to minimize failure detection errors contributed by unequalized high frequency components and shall be as low as possible in order to minimize the difficulty of effecting the low frequency components equalization.

BRIEF DESCRIPTION OF THE DRAWINGS

One similar-redundant signal system in accordance with the invention will now be described, by way of example, with reference to FIGS. 2 and 3 of the accompanying drawings in which.

DETAILED DESCRIPTION OF OF THE INVENTION

Figure 1:
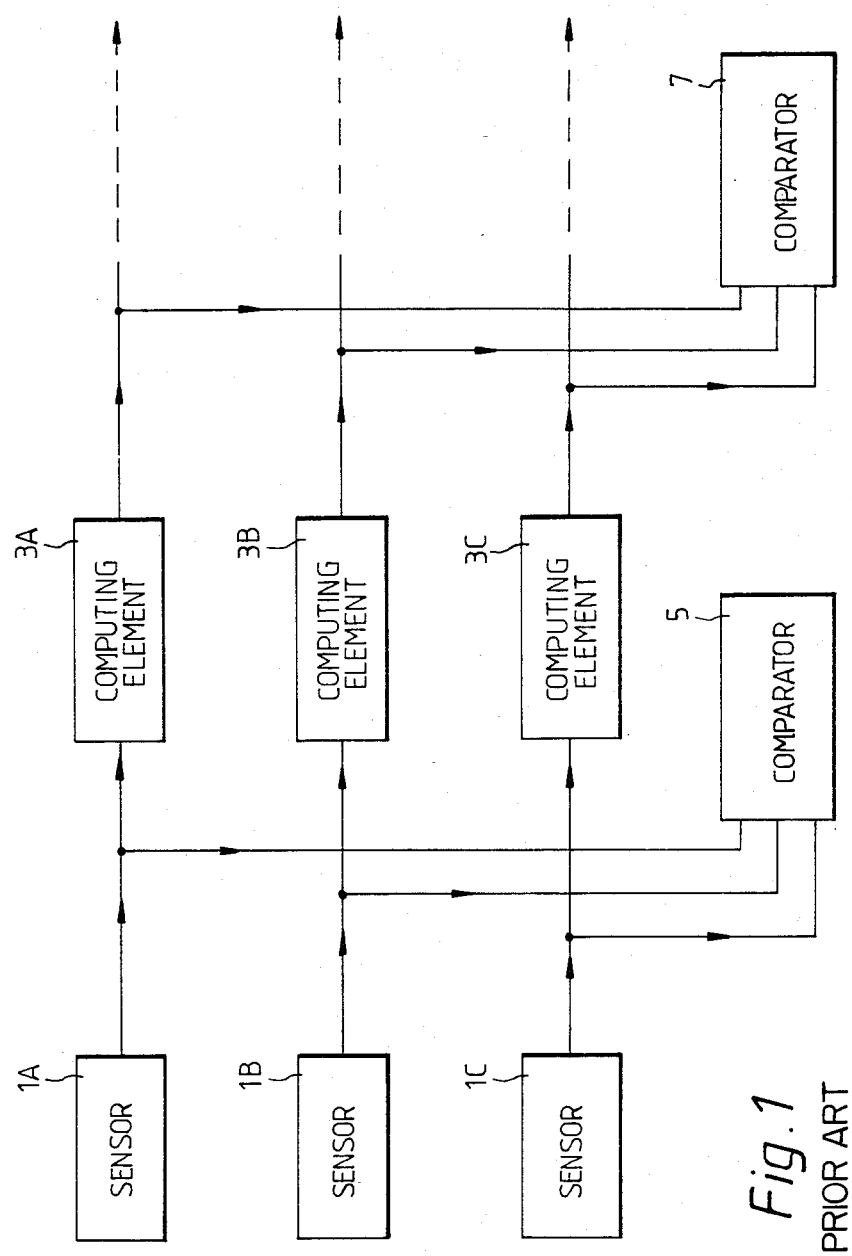
FIG. 1 (referred to above) illustrates, in simplified diagrammatic form, part of a prior art similar-redundant signal system.
Figure 2:
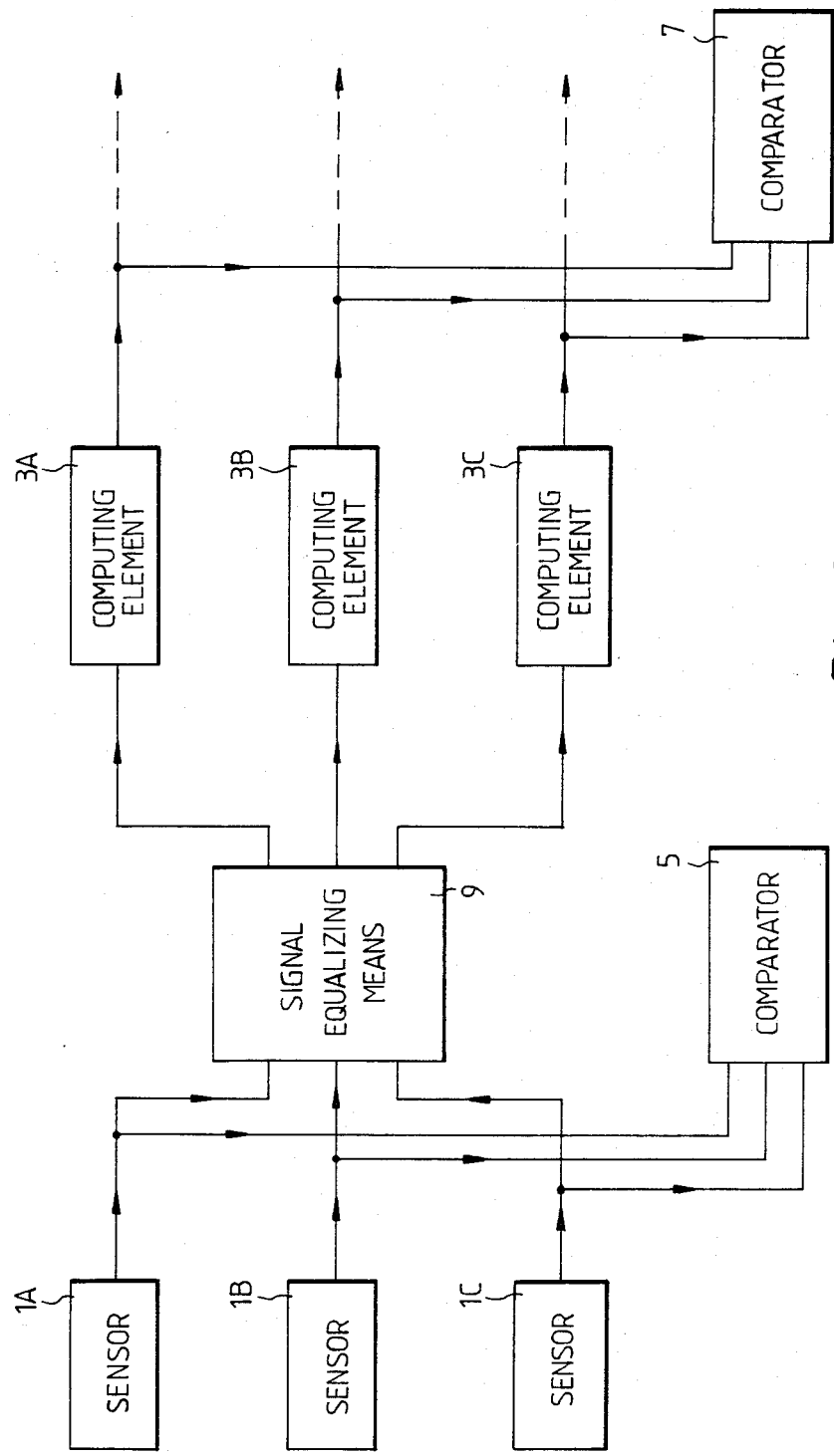
FIG. 2 is a simplified diagrammatic view of part of an exemplificative system of the present invention.

Referring to FIG. 2, the system is the same as that described above with reference to FIG. 1 except that at various locations in the system the signals on the channels are passed through signal equalizing means, one such equalizing means 9 being shown in FIG. 2 between sensors 1A, 1B and 1C and computing elements 3A, 3B and 3C. The elements of FIG. 2 corresponding to elements of FIG. 1 have the same reference numerals as in FIG. 1 and will not be described again.

Figure 3:
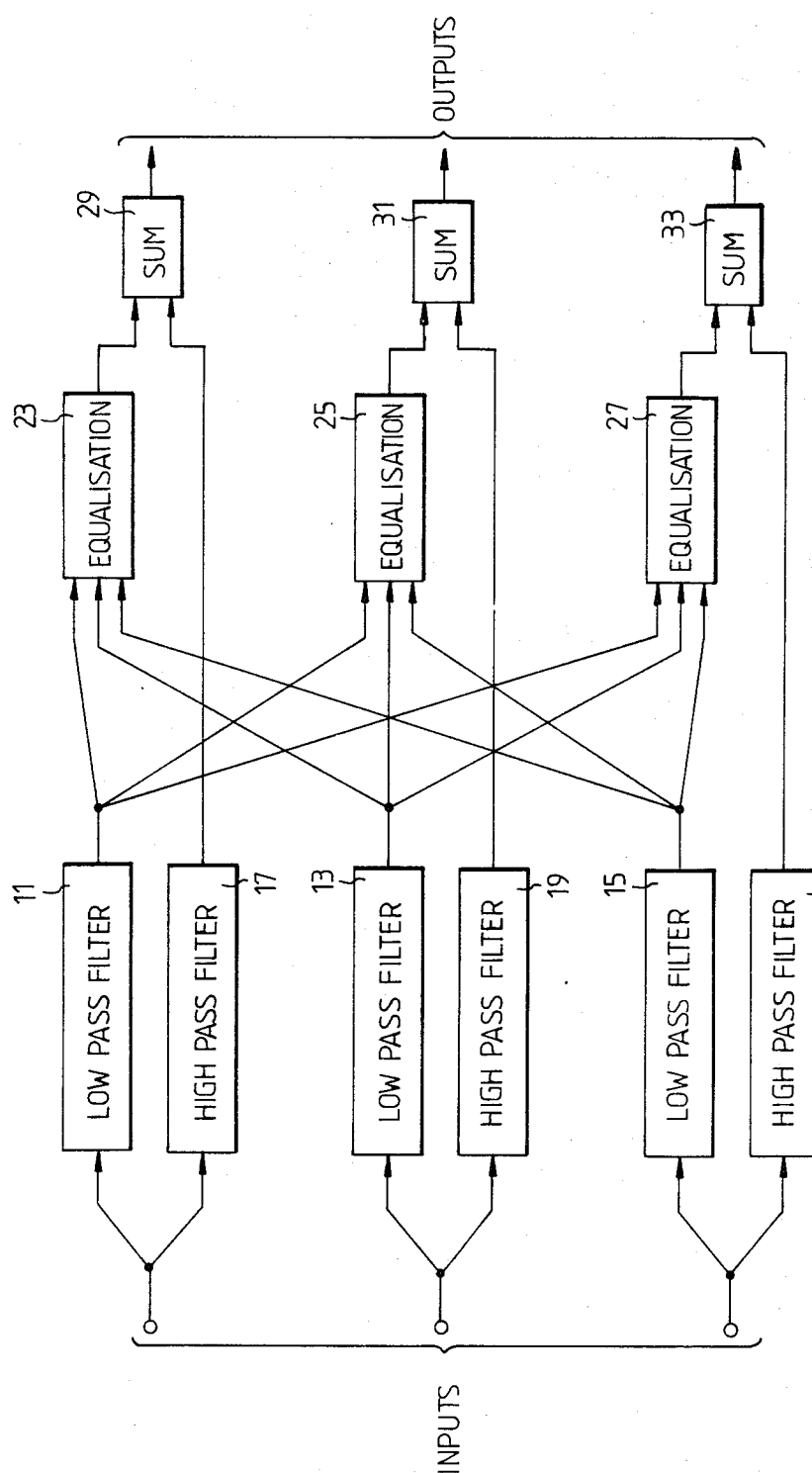
FIG. 3 is a block schematic diagram of a component of the system of FIG. 2.

Referring to FIG. 3, the signal equalizing means 9 has as its inputs the outputs of the sensors 1A, 1B and 1C. Each of these inputs is applied to a respective one of three identical low pass filters 11, 13 and 15 and to a respective one of three identical high pass filters 17, 19 and 21.

The outputs of the three low pass filters 11, 13 and 15 are all applied to each of three equalization circuits 23, 25 and 27. Each of the circuits 23, 25 and 27 processes its inputs in corresponding manner to produce an output which is, in a sense determined by the processing involved, a mean of its inputs. Since the three circuits 23, 25 and 27 are supplied with identical inputs, the outputs of the circuits will, in normal operation, necessarily be identical.

The particular equalization process employed in the circuits 23, 25 and 27 may, for example, be a signal averaging process or it may involve median signal selection from the input signals. The equalization process is preferably carried out using digital processing. Where the signals on the channels are analog signals this will involve digitising the input signals, carrying out equalization digitally, and converting the equalized digital signals to analog signals.

The equalizing means further includes three sum circuits 29, 31 and 33 each of which combines the output of a respective one of the high pass filters 17, 19 and 21 and the output of a respective one of the equalizing circuits 23, 25 and 27.

The outputs of the sum circuits 29, 31 and 33 are respectively fed to the inputs of the computing elements 3A, 3B and 3C.

The filters 11, 13 and 15 have substantially the same cut-off frequency as the filters 17, 19 and 21. Thus the outputs of the equalizing means 9 are three signals corresponding to the equalizing means input signals, but in which the components below the cut-off frequency are necessarily identical, whilst the components in the outputs above the cut-off frequency differ in identical manner to the corresponding components in the inputs to means 9 from sensors 1A, 1B and 1C.

As already explained above, as a consequence of equalizing at lower frequencies only, the equalization can be effected relatively easily, i.e. without the use of high computing power where digital equalization is used.

Equalization of lower frequencies only is possible in any system in which it is found that differences between similar-redundant signals as a result of manufacturing tolerances or differing environmental effects on the channel elements occur mainly in the lower frequency components, with the high frequency components being affected to a significantly lesser extent.

The advantage of equalization is, of course, that the thresholds for failure detection in failure detection comparators down-channel of the equalizing means need take no account of differences in channel elements up-channel of the equalizing means, and may therefore be smaller than in the absence of the equalizing means.

It will be understood that whilst FIG. 2 shows only one equalizing means, in a system according to the invention equalizing means may be provided at any location between adjacent elements in the channel, as desired. Similarly, comparators for failure detection may be used or not at any particular location in the system, as desired. However, it will be apparent that in order to obtain any advantage by equalization, there will necessarily be at least one fault detection comparator down-channel of the equalizing means by at least one channel element.

Where both equalizing means and failure detection comparator means are provided at the same location between channel elements, the circuits of the comparator and equalizing means may conveniently be combined, i.e. by providing comparison circuits within the equalizing means.

It will further be understood that whilst the system of FIG. 2 has three channels, other systems in accordance with the invention may comprise two, or more than three channels.

One particular application of the invention is in parallel redundant error actuated closed loop control systems. However, it should be understood that the invention in its broad connotations is applicable to any similar-redundant signal system and the specification is to be construed accordingly.

I claim:

1. A similar-redundant signal system comprising:
   (A) a plurality of nominally identical signal paths each comprising a number of elements serially connected,
   (B) a failure detection means comprising comparator means having a plurality of inputs equal in number to the number of signal paths to which the input signals at corresponding first locations in said signal paths are respectively applied; and
   (C) equalizing means connected in said signal paths at corresponding second locations upstream of said first locations by at least one said element, said equalizing means having a plurality of inputs equal in number to the number of signal paths to each of which the signal on a respective one of said signal paths is applied, and having a plurality of outputs equal in number to the number of said signal paths, said equalizing means rendering substantially identical only those components of the signals at said outputs which are below a predetermined frequency.

2. A system according to claim 1 wherein said equalizing means utilises digital processing for equalization.

3. A system according to claim 1 wherein said equalizing means effects equalization by a signal averaging process.

4. A system according to claim 1 wherein said equalizing means effects equalization by median signal selection.

5. A system according to claim 1, wherein said equalizing means comprises:
   (i) a plurality of substantially identical high pass filters equal in number to the number of signal paths, each said high pass filter having its input derived from a respective one of said signal paths;
   (ii) a plurality of substantially identical low pass filters equal in number to the number of signal paths, each said low pass filter having its input derived from a respective one of said signal paths;

(iii) a plurality of substantially identical signal equalization circuits equal in number to the number of signal paths, each said equalization circuit having a plurality of inputs equal in number to the number of signal paths to each of which the output of a respective one of said low pass filters is applied, and each said equalization circuit having an output at which is produced a signal which is a mean of the signals at its inputs;

(iv) a plurality of sum circuits equal in number to the number of signal paths, each said sum circuit having a pair of inputs to which are respectively applied the output of a respective one of said equalization circuits and the output of a respective one of said high pass filters, and (v) all of said filters having a cut-off frequency substantially equal to said predetermined frequency.

* * * * *